United States Patent [19]
Rogers et al.

[11] Patent Number: 5,596,293
[45] Date of Patent: Jan. 21, 1997

[54] NOISE RESISTANT RESET CIRCUIT FOR A PHASE DETECTOR IN A PHASE-LOCKED LOOP

[75] Inventors: Alan C. Rogers, Palo Alto; Gaurang A. Shah, Sunnyvale, both of Calif.

[73] Assignee: Sun Microsystems, Inc., Mountain View, Calif.

[21] Appl. No.: 466,087

[22] Filed: Jun. 6, 1995

[51] Int. Cl.$^6$ .............................. H03K 19/20; H03K 5/00
[52] U.S. Cl. .............................. 327/142; 327/12; 327/198; 327/156; 326/104
[58] Field of Search ................................. 327/2, 3, 5, 7, 327/12, 142, 147, 156, 198, 155; 326/114, 104

[56] References Cited

U.S. PATENT DOCUMENTS

| | | | |
|---|---|---|---|
| 4,739,278 | 4/1988 | Des Brisay, Jr. et al. | 327/12 |
| 5,191,239 | 3/1993 | Rogers | 327/12 |

*Primary Examiner*—Timothy P. Callahan
*Assistant Examiner*—Eunja Shin
*Attorney, Agent, or Firm*—Flehr, Hohbach, Test, Albritton & Herbert

[57] ABSTRACT

A reset circuit for a phase detector in a phase-locked loop is described. A first set of input lines receives a first set of latched signals corresponding to a cycle of a reference signal applied to the phase detector of the phase-locked loop. Reset assertion logic is connected to the first set of input lines and executes a predetermined logic function on the first set of latched signals to generate a reset signal that is applied to an output node. The generated reset signal has a cycle duration corresponding to the reference signal cycle duration. Reset de-assertion logic is connected to the first set of input lines and executes a predetermined logic function on the first set of latched signals to de-assert the generated reset signal after a period of time corresponding to the reference signal cycle duration. Similar processing may be performed in relation to a second set of latched signals corresponding to a cycle of a feedback signal applied to the phase detector of the phase-locked loop. The reset circuit is immune from latch race conditions and spurious latch reset operations associated with latches in prior art phase-locked loop phase detectors.

13 Claims, 3 Drawing Sheets

NOISE RESISTANT RESET CIRCUIT FOR A PHASE DETECTOR IN A PHASE-LOCKED LOOP

BRIEF DESCRIPTION OF THE INVENTION

This invention relates generally to phase-locked loops. More particularly, this invention relates to a phase-locked loop phase detector with a noise resistant reset circuit.

BACKGROUND OF THE INVENTION

Phase-locked loop circuits are widely used in electronic systems. These circuits are used to generate an accurate replica of an incoming signal. For example, in a computer, a phase-locked loop is used by a microprocessor to generate an on-chip clock signal from an off-chip clock signal.

FIG. 1 is a generalized illustration of a typical phase-locked loop circuit 20. The circuit 20 includes a phase detector 22 that receives a reference signal and a feedback signal as inputs. The phase detector produces a phase error signal corresponding to the difference in phase between the reference signal and the feedback signal. The phase error signal is processed by a charge pump 24 to provide a pulsed error signal corresponding to the phase error signal. The pulsed error signal is applied to a capacitor 26. The charge supplied by the pulsed error signal develops a control voltage on capacitor 26. The control voltage stored on the capacitor 26 is then used to control the frequency of the output signal of a voltage controlled oscillator (VCO) 28. More particularly, the output signal is controlled to reduce any difference in phase between the reference signal and the feedback signal. The output signal may then be re-processed as a feedback signal for the phase detector 22.

The present invention is directed toward an improvement in existing phase detectors 22. FIG. 2 illustrates a typical prior art digital phase detector 22. The phase detector 22 includes a signal lead portion 30 and a signal lag portion 32, the outputs of which are fed to a reset circuit 34. The phase detector 22 of FIG. 2 is implemented with NOR gates, however other configurations, such as NAND gates, may also be used.

The signal lead portion 30 generates a lead output signal on lead output line 36 when the reference signal is faster (leading) than the feedback signal. The signal lag portion 32 generates a lag output signal on lag output line 38 when the reference signal is slower (lagging) than the feedback signal. The lead output line 36 and the lag output line 38 are connected to a charge pump 24, as shown in FIG. 1.

The signal lead portion 30 and the signal lag portion 32 each function as a pair of latches. In the signal lead portion 30, logic gates 40 and 42 function as a first latch 43 and logic gates 44 and 46 function as a second latch 47. Similarly, in the signal lag portion 32, logic gates 50 and 52 function as a third latch 53 and logic gates 54 and 56 function as a fourth latch 57.

The reset circuit 34, implemented as a four input NOR gate in FIG. 2, is used to reset the four latches (43, 47, 53, 57) after the signal lead portion 30 has detected an edge of a reference signal or the signal lag portion 32 has detected an edge of a feedback signal. The reset output line 60 is connected to each of the four latches (43, 47, 53, 57). When the input lines (62, 64, 66, and 68) to the reset circuit 34 are all low, the reset circuit 34 generates a digital high signal on reset output line 60. This signal resets the four latches (43, 47, 53, 57) of the phase detector 22.

Unfortunately, there is no guarantee that the signal lead portion 30 and the signal lag portion 32 of the phase detector 22 will take the same amount of time to reset. If for example, the signal lead portion 30 should reset before the signal lag portion 32, inputs 62 and 64 will go high before inputs 66 and 68. Once input 62 or 64 goes high, the reset circuit 34 will generate a low signal, thereby de-asserting the reset signal before the signal lag portion 32 has been properly reset. A new sample interval for the phase detector 22 begins when the phase detector reset signal is de-asserted (digital low). Therefore, a phase detector circuit that uses a standard logic gate for the reset circuit 34 is vulnerable to a latch race condition that could cause the phase detector to start sampling inputs before all parts of the phase detector circuit 22 have been reset. More particularly, a latch race condition can preclude all latches in a phase detector 22 from being properly reset.

The reference signal into a phase detector 22 of a phase locked loop 20 may include noise that is erroneously interpreted by the latch 30 as a change in signal state, causing the phase detector 22 to malfunction. It would be highly desirable to provide a reset circuit of a phase detector in a phase-locked loop that is immune from signal noise that erroneously causes a latch setting operation. Further, it would be highly desirable to provide a reset circuit of a phase detector in a phase-locked loop that is not subject to latch race conditions that prevent the resetting of all latches in a phase detector.

SUMMARY OF THE INVENTION

The apparatus of the invention is a reset circuit for a phase detector in a phase-locked loop. A first set of input lines receives a first set of latched signals corresponding to a cycle of a reference signal applied to the phase detector of the phase-locked loop. Reset assertion logic is connected to the first set of input lines and executes a predetermined logic function on the first set of latched signals to generate a reset signal that is applied to an output node. The generated reset signal has a cycle duration corresponding to the reference signal cycle duration. Reset de-assertion logic is connected to the first set of input lines and executes a predetermined logic function on the first set of latched signals to de-assert the generated reset signal after a period of time corresponding to the reference signal cycle duration. Similar processing may be performed in relation to a second set of latched signals corresponding to a cycle of a feedback signal applied to the phase detector of the phase-locked loop.

The method of the invention includes the step of receiving a first set of latched signals corresponding to a cycle of a reference signal applied to the phase detector of the phase-locked loop. A predetermined logic function is then executed on the first set of latched signals to generate a reset signal with a cycle duration corresponding to the reference signal cycle. The reset signal is then applied to an output node. Predetermined logic is then performed in relation to the first set of latched signals to de-assert the reset signal on the output node after a period of time corresponding to the reference signal cycle.

The invention provides a reset circuit for a phase detector in a phase-locked loop that is resistant to commonplace signal noise that can erroneously cause a latch reset operation. Further, the invention provides a reset circuit that is not subject to latch race conditions that prevent the resetting of all latches in a phase detector.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
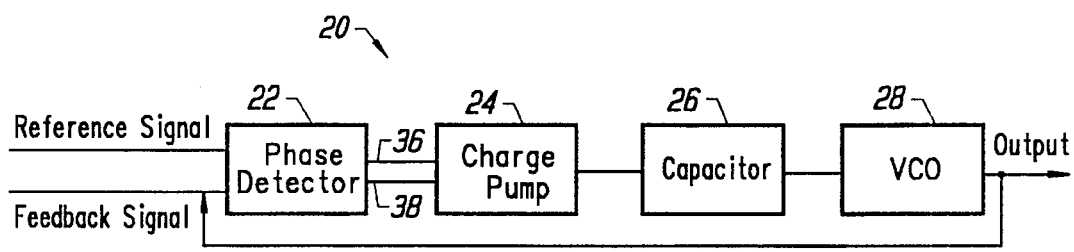
FIG. 1 illustrates a phase-locked loop in accordance with the prior art.
Figure 2:
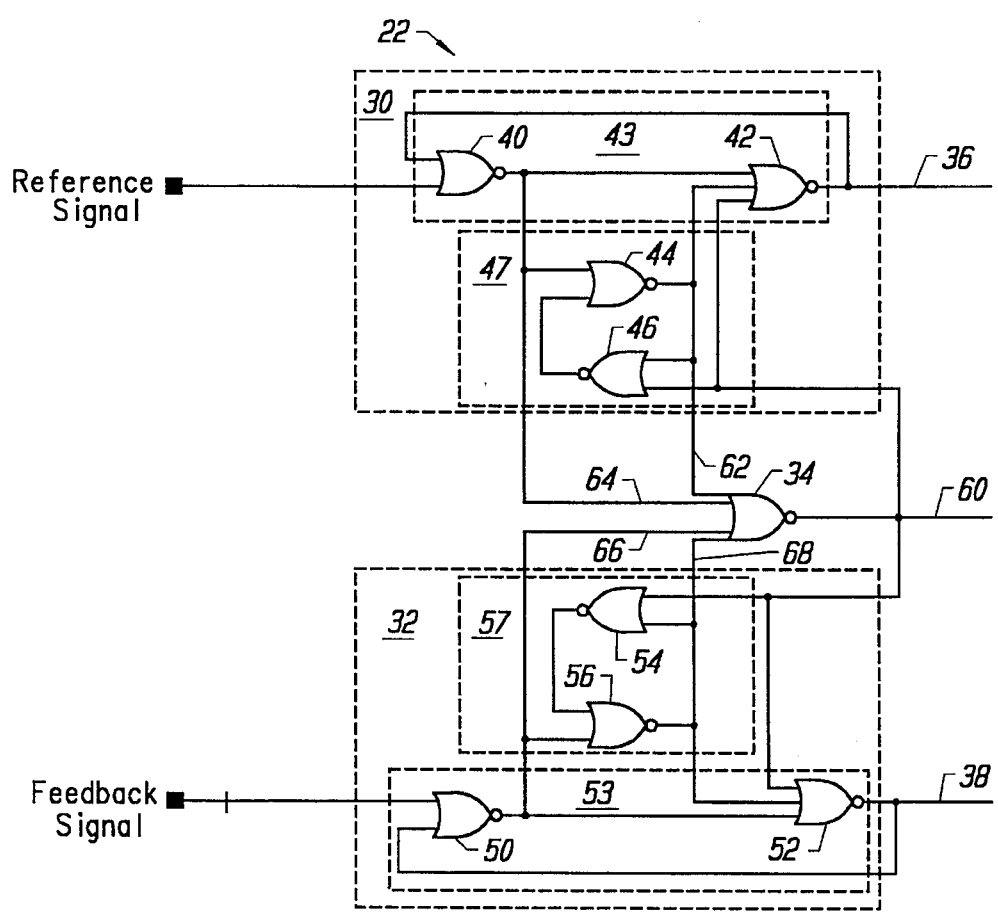
FIG. 2 illustrates a prior art phase-locked loop phase detector.
Figure 3:
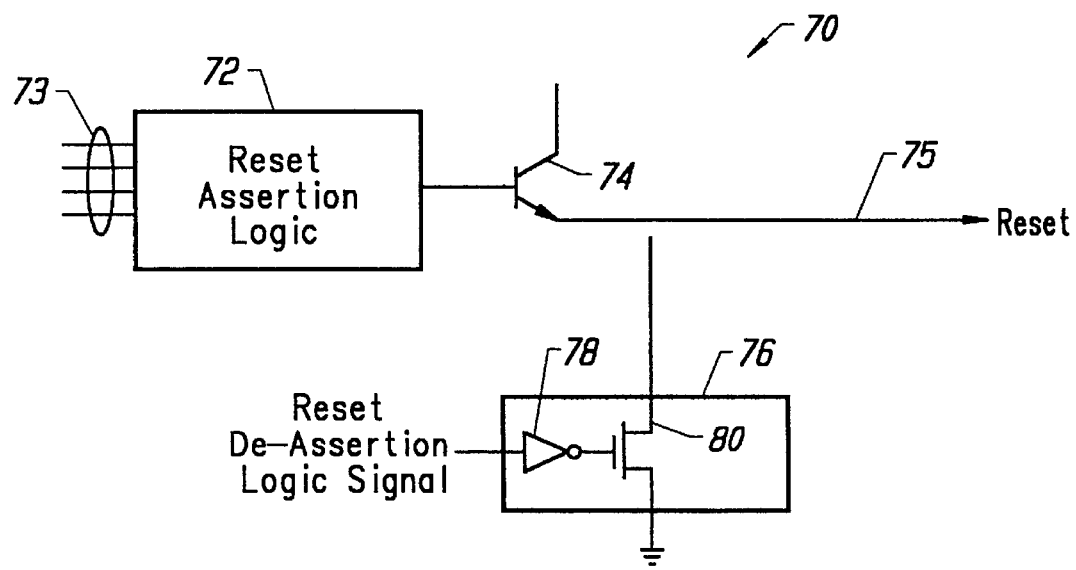
FIG. 3 is a general schematic of the noise immune reset circuit of the invention, which is used in a phase detector of a phase-locked loop.

FIG. 3 is a general illustration of a noise immune reset circuit 70, in accordance with the invention, for use in a phase detector 22 of a phase locked loop 20. The reset circuit 70 includes reset assertion logic 72 driven by a set of input lines 73. Relying upon the example circuit in FIG. 2, the input to the reset assertion logic 70 would be signal lines 62, 64, 66, and 68. In other words, the input to the reset assertion logic 70 is the output of the latches (43, 47, 53, and 57) of the phase detector 22.

The reset assertion logic 70 executes a predetermined logic function on the input signals to generate a reset signal on the output node. In other words, the reset signal is generated in response to a predetermined combination of input signals. As will be described below, the reset signal has a duration corresponding to the duration of a cycle of the reference signal or feedback signal applied to the phase-locked loop.

The reset signal on output node 75 is pulled low in response to reset de-assertion logic 76. In accordance with the invention, the reset de-assertion logic 76 is driven by a reset de-assertion logic signal with a relatively long period. Preferably, the reset de-assertion logic signal is driven by the reference signal into the phase-locked loop.

In the embodiment of FIG. 3, the reset de-assertion logic 76 is implemented as an inverter 78 driving the gate of transistor 80. Thus, when the reset de-assertion logic signal is high, the output of the inverter 78 is low and therefore there is no drive signal for the base of transistor 80. Thus, transistor 80 is off and the reset signal on node 75 can be high. Conversely, if the reset de-assertion logic signal is low, there is a drive signal for the base of transistor 80. Thus, transistor 80 is on and pulls any reset signal on node 75 low. In other words, the reset signal on node 75 follows or corresponds to the reset de-assertion logic signal.

Figure 4A:
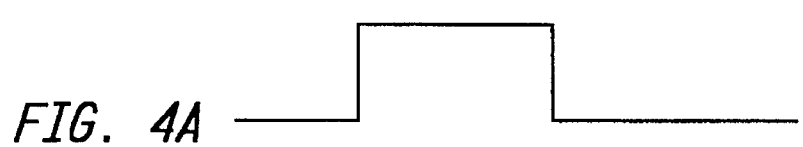
FIG. 4A illustrates a reset de-assertion logic signal for use in the invention.
Figure 4B:
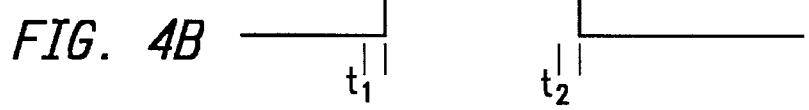
FIG. 4B illustrates a reset signal corresponding to the signal of FIG. 4A.
Figure 4C:
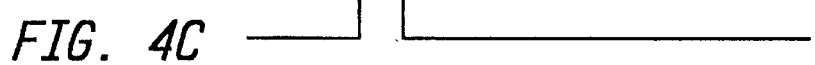
FIG. 4C illustrates a prior art reset de-assertion logic signal corresponding to the signal of FIG. 4A.

This functionality is illustrated in FIGS. 4(a)–4(c). FIG. 4(a) illustrates a reset de-assertion logic signal that is applied to reset de-assertion logic 76. FIG. 4(b) illustrates the corresponding reset signal on output node 75. Note that the reset de-assertion logic signal of FIG. 4(a) goes high, and shortly thereafter, as indicated by the time period marked $t_1$, the reset signal on node 75 goes high. Similarly, shortly after the reset de-assertion logic signal of FIG. 4(a) goes low, as indicated by the time period marked $t_2$, the reset signal on node 75 goes low.

The relatively long reset de-assertion logic signal of the invention stands in stark contrast to prior art reset de-assertion logic signals, as shown in FIG. 4(c). U.S. Pat. No. 5,191,239, assigned to the assignee of the present invention, discloses a phase-locked loop phase detector reset circuit that processes a short pulse reset de-assertion logic signal, as shown in FIG. 4(c).

One advantage of the long reset de-assertion logic signal of the invention is that it provides for a long reset signal that is sufficient to consistently reset all latches of a phase detector, thus avoiding destructive latch race conditions associated with many prior art phase-locked loops. Another benefit of the invention is that during the long reset the phase detector is immune from signal noise that might be interpreted as a real signal transition and cause erroneous phase detector operation.

Figure 5:
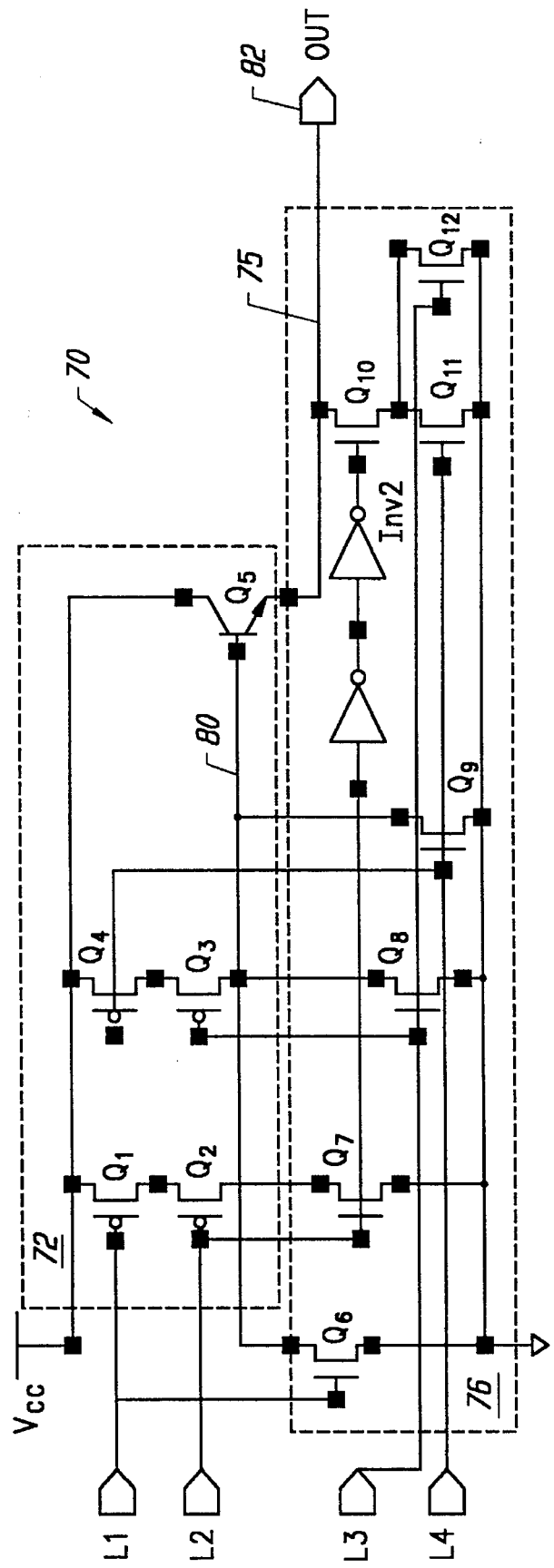
FIG. 5 illustrates one embodiment of a noise immune reset circuit in accordance with the invention.

FIG. 5 illustrates a detailed phase-locked loop phase detector reset circuit 70 in accordance with one embodiment of the invention. The reset circuit 70 includes reset assertion logic 72. The reset assertion logic 72 includes four p-channel transistors Q1, Q2, Q3, and Q4 that operate as signal pull-up logic. The inputs to the reset assertion logic 72 are illustrated in FIG. 5 as being L1, L2, L3, and L4. This notation is used to correspond to the four latches of the phase detector of FIG. 2.

Vcc can generate a high signal on output node 75 when all four inputs (L1, L2, L3, and L4) are low. This condition causes the p-channel transistors Q1, Q2, Q3, and Q4 to turn on, which drives the base of transistor Q5, causing its emitter to produce a high signal on output node 75. When the reset signal on output node 75 is high, the reset signal on output pad 82 is high. Note that a high reset signal on output node 75 corresponds to the reset de-assertion logic 76 being deactivated. In other words, when the reset assertion logic 72 produces a high reset signal on output node 75, the same input signals keep the n-channel pull-down transistors Q6–Q12 of the reset de-assertion logic 76 off, thus the reset de-assertion logic 76 cannot pull the high reset signal on output node 75 low. Specifically, the low signals on input lines L1, L2, L3, and L4 keep transistors Q6–Q12 in an off state because the transistor gates do not have an input drive voltage.

In accordance with the invention, the reset signal on the output node 75 is pulled low when a complete cycle of the reset de-assertion logic signal is completed. As previously indicated, the reset de-assertion logic signal can be the reference signal into the phase-locked loop. The circuit of FIG. 5 treats both the processed reference signal and the processed feedback signal into the phase-locked loop as a single de-assertion logic signal. Thus, when a cycle of the reference signal and the reset of the feedback signal is completed, the reset signal on the output node 75 is pulled low in response to the reset de-assertion logic 76.

Recall that the reference signal is applied to the lead portion 30 of the phase detector 22. The first latch 43 and second latch 47 of the phase detector 22 respectively generate signals on input lines L1 and L2. When a cycle of the reference signal is completed, as indicated by high signals on nodes L1 and L2, the reset de-assertion logic 76 pulls the reset signal on node 75 low. Specifically, transistors Q6 and Q7 pull-down the signal on base node 80 to transistor Q5, thereby shutting transistor Q5 off to force the output node 75 low. Simultaneously, the high signal on the L2 node is driven through inverters INV 1 and INV 2 and turns on transistor Q10, causing transistor Q10 to rapidly pull the output node 75 low.

The processing in relation to the feedback signal is similar. Recall that the feedback signal is applied to the lag region 32 of the phase detector 22. The third latch 53 and the fourth latch 57 of the phase detector 22 respectively generate signals on input lines L3 and L4. When a cycle of the feedback signal is completed, as indicated by high signals on nodes L3 and L4, the reset de-assertion logic 76 pulls the reset signal on node 75 low. Specifically, transistors Q8 and Q9 turn on and pull-down base node 80, forcing transistor Q5 off.

The relatively long cycle for the reset de-assertion logic signal of the invention has the disadvantage that the capture range of the phase-locked loop is diminished. That is, the phase detector 22 of the phase-locked loop does not read input signals while the reset de-assertion logic signal is active. The reduced capture range of the phase-locked loop can be accommodated for through the technology disclosed in the application entitled "A Regulated Complementary Charge Pump Circuit" Ser. No. 08/308,748, filed Sep. 19, 1994.

It should be noted that the circuit of FIG. 5 is similar to the reset gate disclosed in U.S. Pat. No. 5,191,239. However, new input connections to the circuit have resulted in a completely new functionality. Namely, instead of a short reset de-assertion logic signal as disclosed in the '239 patent, the circuit of the present invention is responsive to a relatively long reset de-assertion logic signal. That is, the reset de-assertion logic signal of the invention has a duration corresponding to the duration of the reference signal or feedback signal into the phase-locked loop.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

We claim:

1. A reset circuit for a phase detector in a phase-locked loop, comprising:

a first set of input lines to receive a first set of latched signals corresponding to a cycle of a reference signal applied to said phase detector of said phase-locked loop;

an output node;

reset assertion logic connected to said first set of input lines and said output node, said reset assertion logic executing a predetermined logic function on said first set of latched signals to generate a reset signal on said output node with a cycle duration corresponding to said reference signal cycle; and reset de-assertion logic connected to said first set of input lines and said output node, said reset de-assertion logic executing a predetermined logic function on said first set of latched signals to de-assert said reset signal on said output node after a period of time corresponding to said reference signal cycle.

2. The reset circuit of claim 1 wherein said reset assertion logic includes a set of pull-up transistors executing a logical NOR operation.

3. The reset circuit of claim 1 wherein said reset de-assertion logic includes a set of pull-down transistors executing a logical NOR operation.

4. A reset circuit for a phase detector in a phase-locked loop, comprising:

a first set of input lines to receive a first set of latched signals corresponding to a cycle of a reference signal applied to said phase detector of said phase-locked loop;

a second set of input lines to receive a second set of latched signals corresponding to a cycle of a feedback signal applied to said phase detector of said phase-locked loop;

an output node;

reset assertion logic connected to said first set of input lines, said second set of input lines and said output node, said reset assertion logic executing a predetermined logic function on said first set of latched signals and said second set of latched signals to generate a reset signal on said output node with a cycle duration corresponding to said reference signal cycle or said feedback signal cycle; and reset de-assertion logic connected to said first set of input lines, said second set of input lines and said output node, said reset de-assertion logic executing a predetermined logic function on said first set of latched signals and said second set of latched signals to de-assert said reset signal on said output node after a period of time corresponding to said reference signal cycle or said feedback signal cycle.

5. The reset circuit of claim 4 wherein said reset assertion logic includes a signal pull-up logic section executing a logical NOR operation.

6. The reset circuit of claim 4 wherein said reset de-assertion logic includes a signal pull-down logic section executing a logical NOR operation.

7. The reset circuit of claim 4 forming a portion of said phase-detector in said phase-locked loop that is embedded in a general purpose computer.

8. A method of constructing a reset circuit for a phase detector in a phase-locked loop, said method comprising the steps of:

providing a first set of input lines to receive a first set of latched signals corresponding to a cycle of a reference signal applied to said phase detector of said phase-locked loop;

providing an output node;

providing reset assertion logic connected to said first set of input lines and said output node, said reset assertion logic executing a predetermined logic function on said first set of latched signals to generate a reset signal on said output node with a cycle duration corresponding to said reference signal cycle; and providing reset de-assertion logic connected to said first set of input lines and said output node, said reset de-assertion logic executing a predetermined logic function on said first set of latched signals to de-assert said reset signal on said output node after a period of time corresponding to said reference signal cycle.

9. The method of claim 8 further comprising the step of providing a signal pull-down logic section in said reset de-assertion logic.

10. The method of claim 8 further comprising the step of providing a signal pull-up logic section in said reset assertion logic.

11. The method of claim 8 further comprising the step of installing said phase-locked loop in a general purpose computer.

12. A method of operating a reset circuit for a phase detector in a phase-locked loop, said method comprising the steps of:

receiving a first set of latched signals corresponding to a cycle of a reference signal applied to said phase detector of said phase-locked loop;

executing a predetermined logic function on said first set of latched signals to generate a reset signal with a cycle duration corresponding to said reference signal cycle;

applying said reset signal to an output node; and performing a predetermined logic function on said first set of latched signals to de-assert said reset signal on said output node after a period of time corresponding to said reference signal cycle.

13. The method of claim 12 further comprising the steps of:

receiving a second set of latched signals corresponding to a cycle of a feedback signal applied to said phase detector of said phase-locked loop;

executing a predetermined logic function on said second set of latched signals to generate a second reset signal with a cycle duration corresponding to said feedback signal cycle; and performing a predetermined logic function on said second set of latched signals to de-assert said second reset signal on said output node after a period of time corresponding to said feedback signal cycle.

* * * * *